(12) United States Patent
Bonneville et al.

(10) Patent No.: US 6,367,509 B1
(45) Date of Patent: Apr. 9, 2002

(54) THERMAL HARNESS USING ENCASED CARBON-BASED FIBER AND END ATTACHMENT BRACKETS

(75) Inventors: W. Scott Bonneville, Cupertino; Roger A. Stonier, La Selva Beach, both of CA (US)

(73) Assignee: Space Systems/Loral, Inc., Palo Alto, CA (US)

( * ) Notice: Subject to any disclaimer, the term of this patent is extended or adjusted under 35 U.S.C. 154(b) by 0 days.

(21) Appl. No.: 09/843,898

(22) Filed: Apr. 27, 2001

(51) Int. Cl.$^7$ .................................................... F16L 9/00
(52) U.S. Cl. ...................... 138/96 R; 138/109; 138/110
(58) Field of Search ............................. 138/96 R, 109, 138/110; 385/115, 54

(56) References Cited

U.S. PATENT DOCUMENTS

| | | | | |
|---|---|---|---|---|
| 4,688,891 A | * | 8/1987 | Carratt et al. ................ | 385/115 |
| 4,830,458 A | * | 5/1989 | Hiltebrandt ................. | 385/115 |
| 4,964,692 A | * | 10/1990 | Prescott ....................... | 362/554 |
| 5,077,637 A | | 12/1991 | Martorana et al. .......... | 361/386 |

\* cited by examiner

*Primary Examiner*—Patrick Brinson
(74) *Attorney, Agent, or Firm*—Kenneth W. Float

(57) ABSTRACT

An improved thermal harness or thermal heat strap that comprises carbon based (graphite) fiber heat conducting elements coupled to graphite, composite, polymer, or metal end attachment brackets. An outer casing comprising a tubular braided sleeve surrounds the heat conducting elements and eliminates possible contamination caused by the graphite fibers. The thermal harness may be advantageously used in electronic applications to dissipate heat from high temperature components.

24 Claims, 2 Drawing Sheets

THERMAL HARNESS USING ENCASED CARBON-BASED FIBER AND END ATTACHMENT BRACKETS

BACKGROUND

The present invention relates generally to a heat conducting apparatus, and more particularly, to a thermal harness employing encased carbon based fibers and end attachment brackets for use in electrical and electronic applications.

Thermal Products, Inc. produces commercial thermal straps. These conventional straps use highly conductive carbon fiber weaves having ends encapsulated in copper. Unlike the present invention, these straps lack an outer casing material to not only restrain and protect the carbon fibers from damage and breaking, but also to encase and contain them in order to prevent fiber shedding and contamination of the highly electrically conductive carbon fibers which would not be desirable around electrical and electronic equipment. These straps also differ from the present invention by their use of metallic end fittings that add weight to the structure.

U.S. Pat. No. 5,077,637, issued Dec. 31, 1991, entitled "Solid State Directional Thermal Cable" discloses "a solid state, directional, thermal cable including a bundle of elongated, flexible, carbon fibers having a high thermal conductivity in at least the longitudinal direction. Couplings at each end of the cable, bind together the fiber bundle and thermally engage the cable with objects having different temperatures, for transferring heat between the objects. The thermal cable may be used with a frame that supports a device to or from which heat is to be transferred. The thermal cable engages the frame at a first region proximate the device, and with a second region remote from the device and transfers heat between the first and second regions. The frame may include a composite material whose constituents have at least two different coefficients of thermal expansion, for establishing the overall coefficient of thermal expansion of the composite material. One of the constituents may have a negative coefficient of thermal expansion, and may be a carbon based material."

It is also stated that "In a preferred embodiment of this device, the frame includes a composite material whose constituents have at least two different coefficients of thermal expansion, for establishing the overall coefficient of thermal expansion for the composite material. One of the constituents may have a negative coefficient of thermal expansion and may include a carbon based material such as graphite or diamond."

U.S. Pat. No. 5,077,637 discloses that "The coupling means may be made from a composite of materials, such as metal and carbon" and that the graphite fibers used in the thermal cable "may be enclosed by a flexible sleeve or sheathing 41 such as a plastic tube." U.S. Pat. No. 5,077,637 also discloses that "Coupling 62 may be made from conventional materials or from a composite of materials which have a tuned coefficient of thermal expansion. Fibers 24d are inserted into the coupling, and the coupling is secured around the fibers by means such as crimping, potting the fibers in an adhesive or infiltrafing the fiber ends with molten metal. Fiber ends 15d are then cut and polished smooth."

However, nothing is disclosed or suggested in U.S. Pat. No. 5,077,637 regarding connection to components using an encapsulant (and/or end attachment) and a soft polymer, such as silicone. There is no disclosure or suggestion in U.S. Pat. No. 5,077,637 that the thermal harness may include an encapsulating membrane to contain the tows. There is no disclosure or suggestion in U.S. Pat. No. 5,077,637 that at each node or endpoint, the tows are fanned out and splayed into a silicone matrix. There is no disclosure or suggestion in U.S. Pat. No. 5,077,637 that encapsulant may be used to help apply pressure to the thermal harness end point. There is no disclosure or suggestion in U.S. Pat. No. 5,077,637 that fibers are supported by the end attachment and/or encapsulant and a silicone matrix, which keep the fibers from buckling. There is no disclosure or suggestion in U.S. Pat. No. 5,077,637 regarding the use of an outer casing for the thermal harness that comprises a tubular braided sleeve/jacket, or that the braided sleeve comprises a material such as metal wires, Kevlar™-like fibers, polyben-zimidazole (PBI) fibers, Zylon™ fibers, plastic/textile fibers, or ceramic fibers. This outer braided casing acts as a containment for the carbon fibers and prevents any shedding or contamination of the highly electrically conductive carbon fibers around electrical components and electrical wiring.

There is no disclosure or suggestion in U.S. Pat. No. 5,077,637 regarding the use of an adhesion promoting material for promoting adhesion of the surfaces of individual filaments to the bonding material, or that the adhesion promoting material may be coating, finish, or sizing materials. There is no disclosure or suggestion in U.S. Pat. No. 5,077,637 regarding the use of bonding material which is a polymeric bonding material or a solder or brazing material. There is no disclosure or suggestion in U.S. Pat. No. 5,077,637 that the end fittings are made of either a polymeric resin reinforced graphite composite laminate, a carbon/carbon composite laminate, or a combination of one or the other of these composite laminates.

Accordingly, it would be advantageous to have an improved thermal harness using carbon based fiber and end attachment brackets that may be used in electrical and electronic applications.

SUMMARY OF THE INVENTION

The present invention provides for an improved thermal harness that comprises carbon based (graphite) fiber heat conducting elements coupled to either graphite composite, carbon/carbon composite, or metal end attachment brackets. An outer casing that preferably comprises a tubular braided sleeve surrounds the tubular heat conducting elements and eliminates possible contamination from the graphite fibers. The thermal harness may be advantageously used in electrical and electronic applications to dissipate heat from high temperature, heat-emanating components.

The thermal harness provides for a means for transferring heat from heat-emanating components to heat dispersion components in electrical and electronic equipment. High thermal conductivity carbon based fiber is used as the harness connecting the components. The connection is made using an encapsulant (and/or end attachment) and a "soft" polymer, such as silicone, to make contact with mating items. The harness may be used to directly transfer the heat to radiators and/or a "cold" side of an electronic box. The thermal harness may be used to replace heat spreaders, thermal planes, and other mass-intensive thermal management devices.

The thermal harness significantly reduces weight of computer trays, thermal doublers, and heat pipe assemblies. Attachment using the end attachment brackets is also significantly lighter than conventional devices using copper or aluminum to encapsulate the fiber ends. Encapsulating the fiber in silicone, for example, allows many of the fiber ends to intimately make contact with adjoining surfaces, and may eliminate resistive losses found at conventional interfaces.

Use of the thermal harness reduces the weight of electronic assemblies by replacing currently-used components required to reduce junction temperatures. The thermal harness may attach directly to the heat generating components and creates a bridge to the heat dissipating components. A reduced-to-practice embodiment of the thermal harness is extremely lightweight since the carbon fiber has a density of approximately 1.7–2.3 g/cm$^3$. The thermal harness provides efficient heat transfer and may eliminate thermal planes in space structures.

The thermal harness has carbon fiber bundled with groups of tows going to a heat-generating element. Encapsulant may be used to help apply pressure to the thermal harness end point. The encapsulant may also have provisions for fasteners, springs, or clips to secure the end of the harness. One advantage of this technique is the direct contact between individual fibers and the mating surface. Fibers are supported by the end attachment and/or encapsulant and the silicone matrix. In this manner, the fibers are kept from buckling.

BRIEF DESCRIPTION OF THE DRAWINGS

The various features and advantages of the present invention may be more readily understood with reference to the following detailed description taken in conjunction with the accompanying drawings wherein like reference numerals designate like structural elements, and in which.

DETAILED DESCRIPTION

Figure 1:
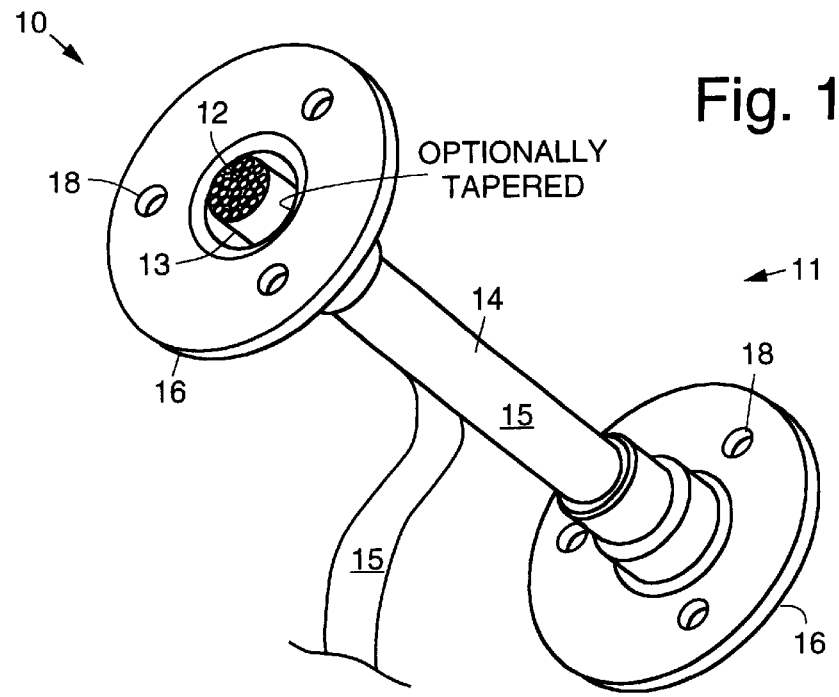
FIG. 1 illustrates an exemplary embodiment of a thermal harness in accordance with the principles of the present invention.

Referring to the drawing figures, FIG. 1 illustrates an exemplary embodiment of a thermal harness 10 in accordance with the principles of the present invention. The exemplary thermal harness 10 comprises a flexible graphite fiber thermal heat strap 11. The flexible graphite fiber thermal heat strap 11 includes a plurality of unidirectionally-oriented high thermal conductivity graphite (carbon) fibers 12 in the form of a graphite fiber bundle 13 or plurality of bundles 13. An outer encasing material like a tubular braided sleeve/jacket 14 is preferably used to encase the fiber bundle 13.

The graphite fiber bundle 13 and outer braided tubular sleeve/jacket 14 forms a tubular heat strap element 15. Multiple graphite fiber bundles 13 or tubular heat strap elements 15 are normally used in the construction of the flexible graphite fiber thermal heat strap 11. The graphite fiber bundle 13 or bundles (and the outer braided tubular sleeve/jacket 14) is bonded to end fittings 16 using bonding material 17. Both end fittings 16 may have through holes 18 formed therein to allow attachment to a heat source or heat sink.

The thermal harness 10 may have end fittings 16 having a tapered inner diameter such that axial force on the end fitting 16 compresses a material such as silicone or other polymer about the graphite fiber bundle 13. The end fittings 16 may be comprised of any suitable material including, for example, graphite fiber composite material, which may comprise graphite fibers oriented predominately through the thickness of the end fittings 16, graphite fiber composite and metal material, molded polymer, machined polymer and plastic, polymeric resin reinforced graphite composite laminate and carbon/carbon composite laminate, sections of a substantially unidirectional fiber tape wrapped circular rod, or sections of a pultruded composite rod.

Figure 2:
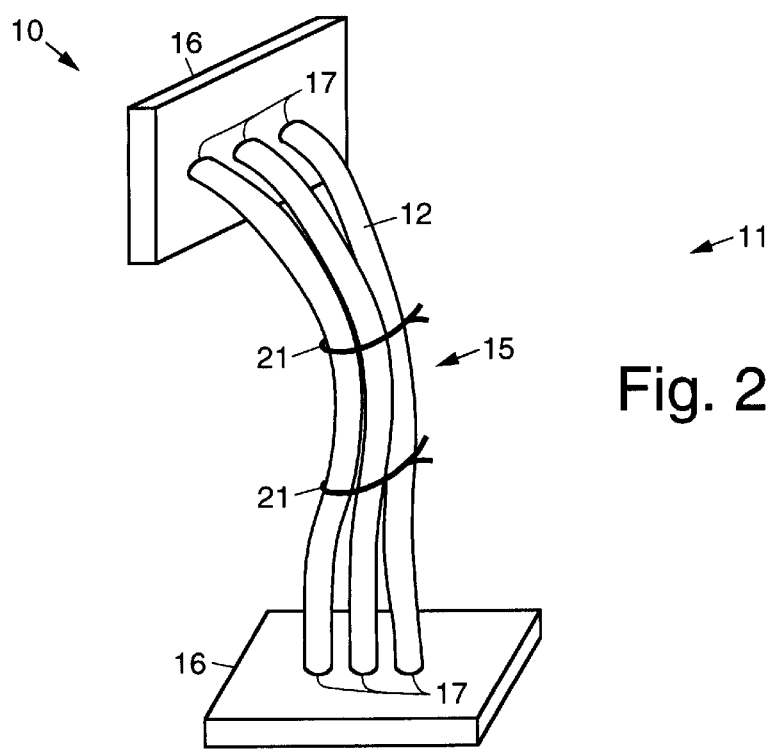
FIG. 2 illustrates the structure of an exemplary thermal harness.

FIG. 2 illustrates details of the structure of an exemplary thermal harness 10. The graphite fiber bundles 13 or tubular heat strap elements 15 are bonded using bonding material 17 into a graphite fiber composite or combination graphite fiber composite and metal end fitting 16 on each end of the tubular heat strap elements 15. A plurality of graphite fiber bundles 13 may be secured together using commonly available tie straps 21, for example.

The end fitting 16 on one end of the flexible graphite thermal heat strap 11 may then be bonded to or mechanically attached (with a current art thermal gasket or thermal interface material) to a "hot" part (where heat will be withdrawn). The end fitting 16 at the opposite end of the flexible graphite thermal heat strap 11 may also be bonded to or mechanically attached (with a thermal gasket or thermal interface material) to a heat sink (where the heat will flow to). Both end fittings 16 may have through holes 18 formed therein to allow attachment to a heat source or heat sink.

Figure 3:
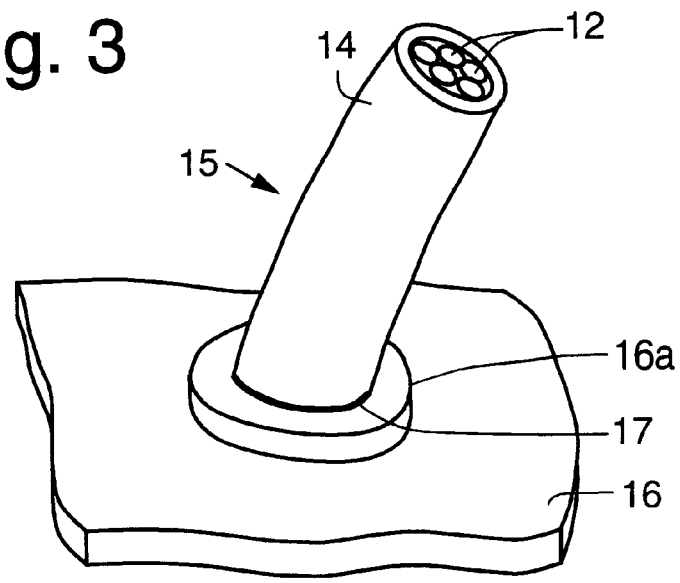
FIG. 3 illustrates a portion of the thermal harness showing details of its structure.
Figure 4:
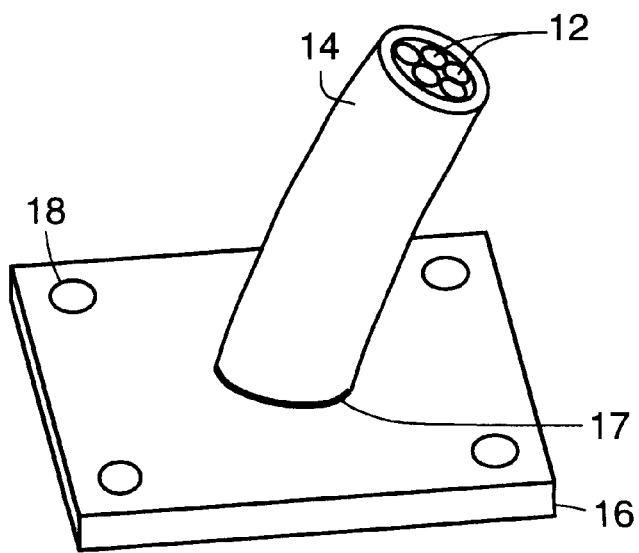
FIG. 4 illustrates additional details of the thermal harness.

FIG. 3 illustrates a portion of the thermal harness 10 showing details of its structure. The thermal harness 10 shown in FIG. 3 has an end fitting 16 with an additional laminated layer 16a that surrounds the tubular heat strap element 15 in the area where the bonding material 17 is disposed. FIG. 4 illustrates additional details of the thermal harness 10. FIG. 4 illustrates a thermal harness 10 that is bonded to an end fitting 16 having through holes 18 therein used to secure the end fitting 16 to a heat source or heat sink.

The flexible graphite fiber thermal heat strap 11 is used to transfer heat from one physical location on a part or assembly to another physical location on the same part or to a different part. The flexible graphite fiber thermal heat strap 11 provides a means for transferring heat which is significantly lighter in mass than the current art of using a metal heat strap or using a graphite fiber heat strap having end fittings constructed entirely of metal.

Because of the high thermal efficiency of both the tubular heat strap elements Is and the end fittings 16, the same or better thermal performance can be achieved than with the current art heat straps at a significantly reduced mass. Therefore, the present invention may be utilized for mass-critical applications on spacecraft, for example.

The flexible graphite fiber thermal heat strap 11 also provides a means for transferring heat without the potential corrosion problems of metallic heat straps or graphite heat straps having metallic end fittings 16. Also, the length of the flexible graphite fiber thermal heat strap 11 may be varied depending on the specific application by varying the length of the tubular heat strap elements 15 before they are installed into the end fittings 16.

The use of a braided tubular element as an integral part of the tubular heat strap element 15 that provides a thin protective outer sleeve/jacket 14 is a significant improvement over current art which uses only braided graphite fibers (without a sleeve or with a stiff plastic sleeve) as thermally conductive elements of the heat strap. The present invention eliminates contamination from the graphite fibers 12, because the graphite (carbon) fibers 12 are totally encased within the outer braided sleeve/jacket 14 that is not constructed of graphite fibers.

The material used in the tubular sleeve/jacket 14 and the material used in the coating on the outside surfaces of the graphite (carbon) fibers 12 making up the graphite fiber bundle 13 may be selected to obtain a tubular heat strap element 15 that is "hot", radiating the small amount of heat that is conducted perpendicular to the length of the graphite (carbon) fibers 12 and the graphite fiber bundles 13 by utilizing a fiber material in the construction of the braided sleeve/jacket 14 and/or a coating material on the (carbon) fibers 12 that emits heat by having a high surface emissivity. Conversely a tubular heat strap element 15 that is "cold", retaining the conducted heat and minimizing emittance from the graphite (carbon) fibers 12 and the braided sleeve/jacket 14) making up the graphite fiber bundle 13, may also be obtained by utilizing a material in the braided sleeve/Jacket 14 and/or a coating on the (carbon) fibers 12 that make up the graphite fiber bundle 13 that has a low surface emissivity.

The construction of the end fitting 16 may also be varied to provide a fitting 16 with a uniform temperature across its entire surface that attaches to the heat sink (with no "hot spots"), or specific "hot spot" areas within the end fitting 16 may also be achieved if desired.

Thus, the flexible graphite fiber thermal heat strap 11 includes tubular heat strap elements 15 containing graphite fiber bundles 13 comprising unidirectionally oriented high thermal conductivity graphite (carbon) fibers 12 with an outer casing that preferably comprises a tubular braided sleeve/jacket 14. The tubular heat strap elements 15 are bonded with bonding material 17 to end fittings 16.

High thermal conductivity graphite (carbon) fibers 12 are used as the primary heat transferring material of the flexible graphite fiber thermal heat strap 11. The graphite (carbon) fibers 12 include tows or yarns containing many individual graphite filaments. The graphite (carbon) fibers 12 utilized in the graphite fiber bundle 13 are commercially available fibers such as K-800, and K-1100 which are marketed by BP Amoco Chemicals, K13C2U and K13D2U which are marketed by Mitsubishi Chemical America, Inc, and YS-95A fibers marketed by Nippon Graphite Fiber Corporation. A number of different graphite fibers may be selected, depending on cost versus thermal efficiency considerations.

Special coatings, finishes or sizings may be applied to the graphite (carbon) fibers 12 to enhance the physical, mechanical or thermal performance of the flexible graphite fiber thermal heat strap 11. For example, a special finish or sizing may be used on the graphite fibers/filaments making up the graphite fiber bundle 13 to protect them from any abrasion of a graphite fiber/filament rubbing or moving against another graphite fiber/filament within the graphite fiber bundle 13, when the flexible graphite fiber thermal heat strap 11 is bent or moved. A special coating, finish or sizing may also be used to promote adhesion of the surfaces of the individual filaments to the particular bonding material 17 used, which is either a polymeric bonding material or a solder or brazing material that is used to attach the tubular heat strap elements 15 to the end fittings 16.

The graphite fiber bundles 13 are all oriented along the length of the tubular heat strap element 15 of the flexible graphite fiber thermal heat strap 11. Each graphite fiber bundle 13 is incorporated into the tubular braided sleeve/jacket 14 during the braiding operation that manufactures the outer braided sleeve/jacket 14 of the tubular heat strap element 15.

The thin tubular tightly-braided sleeve/jacket 14 is used to not only contain and protect the fragile graphite fiber bundle 13, but also to encase and contain the graphite fiber bundle 13 so that any broken graphite filaments or particles can not contaminate components adjacent to or in contact with the thermal harness; particularly electronic components or electrical connections where this contamination could cause an electrical short circuit The combination of the two make up the tubular heat strap element 15. The tubular braided sleeve/jacket 14 may be constructed using a conventional braiding machine and is typical of the current art of forming a braided protective outer sleeve/jacket around electrical wire cables or in the manufacturing of current art shoe laces having internal unidirectional structural textile filaments.

The material used in the braided sleeve/jacket 14 may be either metal (copper, aluminum or steel) including very small diameter metal wires, Kevlar™, Zylon™ or polybenzimidazole (PBI) fibers, or a plastic/textile or ceramic fiber material. The selected material depends upon the operating temperature of the thermal harness 10 and the flexible graphite fiber thermal heat strap 11 which also determines the bonding material 17 used to attach the tubular heat strap elements 15 to the end fittings 16, and may also depend upon the thermo-optical properties desired for the braided sleeve/jacket 14 in order for the outer surface of the sleeve/jacket to be "hot" (radiating heat) or "cold" (insulating heat). This depends on what is in close proximity to or touching the thermal harness 10 and the flexible graphite fiber thermal heat strap 11, which may be sensitive to heat, such as electronic components.

The tubular braided sleeve/jacket 14 also provides for the primary structural attachment of the tubular heat strap element 15 to the end fittings 16, and also provides enough stiffness/rigidity so that the flexible graphite fiber thermal heat strap 11 cannot be bent to a small enough radius to damage the graphite (carbon) fibers 12 in the graphite fiber bundle 13. The use of a braided sleeve/jacket that contains graphite fibers, like previous art, results in a more structurally robust thermal heat strap 11 and also eliminates the problem of graphite filaments breaking loose and causing contamination and potential problems of electrical shorting of electronic equipment.

The tubular heat strap element 15 comprises the graphite fiber bundle 13 and braided sleeve/jacket 14 surrounding it. The diameter of the tubular heat strap element 15 may be varied by varying the number of graphite (carbon) fibers 12 in the graphite fiber bundle 13 or the number of graphite fiber bundles 13 and the size of the braided sleeve/jacket 14. The size and configuration of the flexible graphite fiber thermal heat strap 11 depends on the number of tubular heat strap elements 15 that are used in its construction, the thickness of the end fittings and the mechanical flexibility desired.

The bonding material 17 is used to attach the tubular heat strap elements 15 to the end fittings 16. The bonding material 17 may be a plastic or polymeric resin such as an epoxy or silicone or it can be a ceramic adhesive or a metal or solder. For adhesively bonding the tubular heat strap elements 15 into the end fittings 16, a polymeric or ceramic adhesive may be used.

Because of the flow of the bonding material either at room temperature or when heated, and the capillary action of the graphite (carbon) fibers 12 in the graphite fiber bundle 13, the polymeric resin flows into the unidirectional graphite fiber bundle 13 within the braided sleeve/jacket 14 and also impregnates the filaments or fibers of the braided sleeve/jacket 14 that are within holes formed in the end fitting 16 into which the graphite fiber bundle 13 and braided sleeve/ jacket 14 are inserted, A plastic or polymeric resin bonding material 17 normally has a filler material including particles of a high thermal conductive material such as boron nitride, alumna, carbon, graphite or metal. If solder is used as the bonding material 17, the graphite fibers 12 in the fiber bundle 13 and the filaments or fibers of the braided sleeve/jacket 14 are coated with a compatible finish or metallized surface to obtain a good bond to the solder. A typical metal surface layer may be nickel, silver, chrome, aluminum, gold or a combination thereof.

The end fittings 16 are preferably comprised of either a polymeric resin reinforced graphite composite laminate, or a carbon/carbon composite laminate. For these composite laminates, including the polymeric resin laminate and the carbon/carbon laminate, the graphite fibers 12 are also high thermal conductivity graphite (carbon) fibers 12, and essentially all of the graphite (carbon) fibers 12 in the laminates are oriented in the same direction as the graphite (carbon) fibers 12 in the graphite fiber bundle 13 of the tubular heat strap element 15.

In this way, the heat carried in the graphite fiber bundle 13 of the tubular heat strap elements 15 is transferred to other graphite (carbon) fibers 12 in the end fitting 16 with the fibers oriented in the same direction as the graphite (carbon) fibers 12 in the graphite fiber bundle 13 and in the same direction as the desired heat flow. Thus, the most efficient transfer of heat is obtained.

Composite end fittings 16 are constructed either by conventional molding techniques or by cutting or machining sections from a predominantly unidirectional fiber tape wrapped circular rod or they may also be a section (circular, square, rectangular or other shape) cut from a pultruded composite rod. The polymeric resin laminate end fittings 16 is comprised of current art polymers such as epoxy or cyanate ester. The carbon/carbon laminate end fittings 16 is comprised of a current art carbon/carbon composite starting with a predominately unidirectional fiber tape wrapped circular rod 20 that is then converted into a carbon/carbon composite using current art materials and processing techniques.

The end fittings 16 may be flat or curved in shape depending on the geometry of the surface that the end fittings 16 are designed to attach to. Curved composite end fittings 16 are machined from these rods. The end fittings 16 of the flexible graphite fiber thermal heat strap 11 may have a different configuration at each end. The end fittings 16 may have drilled through holes or partially drilled holes therein for attachment of the individual tubular beat strap elements 15.

The tubular heat strap elements 15 are attached with a bonding material 17 to the end fittings 16. Holes slightly larger in diameter than the tubular heat strap elements 15 may be drilled either partially through or completely through the end fitting 16 so that a single tubular heat strap element 15 may be fitted into the drilled hole.

If the tubular heat strap elements 15 are attached to an end fitting 16 that has a drilled through hole to accommodate the heat strap elements 15, the graphite (carbon) fibers 12 in the graphite fiber bundle 13 may be sealed with a thin coating of a high thermal conductivity polymer material in order to protection against contamination of small broken filaments or particles from the graphite (carbon) fibers 12. The polymeric bonding material 17 may also be used to seal the tubular heat strap element 15 that is attached into an end fitting 16 having through holes to accommodate it.

Since a plurality of tubular heat strap elements 15 are normally used in each flexible graphite fiber thermal heat strap 11 a plurality of holes are formed in the end fitting 16, and each individual hole receives one end of a tubular heat strap element 15. If solder is used as the bonding material 17 to attach the tubular heat strap elements 15, then a small circular preform plug of solder is placed at the bottom of each hole and a wrap of preform solder is placed around the tubular element.

The end of the tubular heat strap element 15 (at the point it enters the hole) is heated until the solder flows, or the end fitting 16 with the tubular heat strap elements 15 placed in the holes with the solder is then placed in an oven to reflow the solder. Brazing may be done in a similar way with a brazing material and a high temperature vacuum furnace or oven. An end fitting 16 comprised of carbon/carbon composite and a braided sleeve/jacket constructed of steel wire filaments may be required if brazing is used because of the extremely high temperatures that are involved.

To improve on the mechanical performance of the portion of the braided sleeve/jacket 14 adjacent to the end fitting 16, it may be locally impregnated with a semi-flexible polymeric material such as a polyurethane, epoxy or silicone resin, for example. The tubular braided sleeve/jacket 14 of the flexible graphite fiber thermal heat strap 11 may also be painted with a flexible thermal control coating/paint to improve the thermo-optical properties. This not only provides improved thermal performance but provides an additional seal of the braided sleeve/jacket 14 to prevent any possibility of graphite contamination.

Multiple tubular heat strap elements 15 making up the flexible graphite fiber thermal heat strap 11 may be held together with tie cords, plastic tie wraps or wire or plastic clamps. The various tubular heat strap elements may be twisted together or interlaced to produce a compact flexible graphite fiber thermal heat strap 11.

Use of the thermal harness reduces the weight of the electronic hardware in which it is employed by replacing currently-used components or devices required to reduce junction temperatures. The thermal harness 10 attaches directly to the heat generating components and creates a bridge to the heat dissipating components. A reduced-to-practice embodiment of the thermal harness 10 is extremely lightweight since the carbon fiber has a density of approximately 1.7–2.3 g/cm$^3$. The thermal harness 10 provides efficient heat transfer and may eliminate thermal planes in space structures.

Thus, an improved flexible graphite fiber thermal heat strap or harness has been disclosed. It is to be understood that the described embodiments are merely illustrative of some of the many specific embodiments that represent applications of the principles of the present invention. Clearly, numerous and other arrangements can be readily devised by those skilled in the art without departing from the scope of the invention.

What is claimed is:

1. A thermal harness comprising:
   a flexible graphite fiber thermal heat strap comprising:
   one or more tubular heat conducting elements that each contain one or more graphite fiber bundles comprising unidirectionally oriented high thermal conductivity graphite fibers contained within a protective flexible tubular braided sleeve and having end fittings bonded using bonding material to the respective ends of each of the tubular heat conducting elements.

2. The thermal harness recited in claim 1 wherein the flexible tubular braided sleeve is a material selected from the group consisting of metal wires, Kevlar fibers, Zylon fibers, polybenzimidazole fibers, plastic/textile fibers and ceramic fibers.

3. The thermal harness recited in claim 1 wherein the flexible outer tubular braided sleeve comprises a flexible polymeric thermal control coating.

4. The thermal harness recited in claim 3 wherein the flexible polymeric thermal control coating is a material selected from the group consisting of silicone, polyurethane, epoxy and thermoplastic coating materials.

5. The thermal harness 1 recited in claim 1 wherein the graphite fibers in the graphite fiber bundles have a metal coated outer surface.

6. The thermal harness recited in claim 1 wherein the end fittings comprise graphite fiber composite end fittings.

7. The thermal harness recited in claim 6 wherein the graphite fiber composite end fittings comprise graphite fibers oriented predominately through the thickness of the end fittings.

8. The thermal harness recited in claim 1 wherein the end fittings comprise graphite fiber composite and metal end fittings.

9. The thermal harness recited in claim 1 wherein the end fittings are made of a material selected from the group consisting of molded polymer, machined polymer and plastic.

10. The thermal harness recited in claim 1 wherein the end fittings are made of a material selected from the group consisting of polymeric resin reinforced graphite composite laminate and carbon/carbon composite laminate.

11. The thermal harness recited in claim 1 wherein the end fittings comprise polymer end fittings.

12. The thermal harness recited in claim 1 further comprising an adhesion promoting material for promoting adhesion of the surfaces of individual filaments to the bonding material.

13. The thermal harness recited in claim 12 wherein the adhesion promoting material is selected from the group consisting of coating, finish, and sizing materials.

14. The thermal harness recited in claim 1 wherein the bonding material is a material selected from the group consisting of polymeric bonding material and solder.

15. The thermal harness recited in claim 1 wherein the tubular braided sleeve is a material selected from the group consisting of metal wires, Kevlar-like fibers, polybenzemidizole fibers, plastic/textile fibers, and ceramic fibers.

16. The thermal harness recited in claim 1 wherein the bonding material is a material selected from the group consisting of epoxy, silicone, and ceramic adhesive.

17. The thermal harness recited in claim 1 wherein the end fittings comprise sections of a substantially unidirectional fiber tape wrapped circular rod.

18. The thermal harness recited in claim 1 wherein the end fittings comprise sections of a pultruded composite rod.

19. The thermal harness recited in claim 1 wherein a portion of the braided sleeve adjacent to the end fitting is locally impregnated with a semi-flexible polymeric material.

20. The thermal harness recited in claim 19 wherein the semi-flexible polymeric material is selected from the group consisting of polyurethane, epoxy or silicone resin.

21. The thermal harness recited in claim 2 wherein the materials comprising the flexible tubular braided sleeve are braided in a continuous manner over the heat conducting elements.

22. The thermal harness recited in claim 1 wherein the end fittings have a tapered inner diameter such that axial force applied to the end fittings compresses a material about the graphite fiber bundle.

23. The thermal harness recited in claim 22 wherein the material comprises a polymer material.

24. The thermal harness recited in claim 22 wherein the material comprises a silicone.

* * * * *